United States Patent
Burdick

(10) Patent No.: US 11,431,067 B2
(45) Date of Patent: Aug. 30, 2022

(54) DIELECTRIC CAVITY NOTCH FILTER

(71) Applicant: Knowles Cazenovia, Inc., Cazenovia, NY (US)

(72) Inventor: Jared Parker Burdick, Fayetteville, NY (US)

(73) Assignee: Knowles Cazenovia, Inc., Cazenovia, NY (US)

(*) Notice: Subject to any disclaimer, the term of this patent is extended or adjusted under 35 U.S.C. 154(b) by 91 days.

(21) Appl. No.: 16/904,252

(22) Filed: Jun. 17, 2020

(65) Prior Publication Data

US 2020/0403286 A1   Dec. 24, 2020

Related U.S. Application Data

(60) Provisional application No. 62/863,519, filed on Jun. 19, 2019.

(51) Int. Cl.
  *H01P 1/20*   (2006.01)
  *H05K 3/30*   (2006.01)
  *H05K 1/02*   (2006.01)

(52) U.S. Cl.
  CPC ......... *H01P 1/2002* (2013.01); *H05K 1/0243* (2013.01); *H05K 3/303* (2013.01); *H05K 2201/1006* (2013.01)

(58) Field of Classification Search
  CPC ............ H01P 1/202; H05K 2201/1006; H05K 1/0243; H05K 3/303
  See application file for complete search history.

(56) References Cited

U.S. PATENT DOCUMENTS

| | | | |
|---|---|---|---|
| 6,566,986 B2 * | 5/2003 | Sano | H01P 1/207 333/202 |
| 7,449,980 B2 | 11/2008 | Bates | |
| 7,663,454 B2 | 2/2010 | Bates | |
| 7,956,708 B2 | 6/2011 | Bates | |
| 9,490,768 B2 | 11/2016 | Randall | |
| 9,812,750 B2 | 11/2017 | Randall | |
| 10,547,096 B2 | 1/2020 | Bates | |

(Continued)

FOREIGN PATENT DOCUMENTS

| | | | |
|---|---|---|---|
| CN | 104466308 A | 3/2015 | |
| CN | 212011203 U | 11/2020 | |
| WO | WO-2019154496 A1 * | 8/2019 | H01P 1/20318 |

OTHER PUBLICATIONS

Nadeau, U.S. Appl. No. 16/699,187, U.S. Patent and Trademark Office, Nov. 29, 2019.

(Continued)

*Primary Examiner* — Stephen E. Jones
*Assistant Examiner* — Kimberly E Glenn
(74) *Attorney, Agent, or Firm* — Loppnow & Chapa; Matthew C. Loppnow; Roland K. Bowler, II

(57) ABSTRACT

A band stop filter can include a circuit board having a first surface and an opposing second surface. The circuit board can have a transmission line on the first surface. The band stop filter can include a dielectric cavity resonator physically coupled to the second surface of the circuit board. The dielectric cavity resonator can have a coupling aperture configured to magnetically couple the dielectric cavity resonator to the transmission line, and to cause excitation of the dielectric cavity resonator in a second order transverse electric (TE) mode.

19 Claims, 7 Drawing Sheets

(56) References Cited

U.S. PATENT DOCUMENTS

| | | |
|---|---|---|
| 10,770,776 B2 | 9/2020 | Bates |
| 2014/0097913 A1 | 4/2014 | Cooper et al. |
| 2019/0081380 A1 | 3/2019 | Bates |
| 2020/0021030 A1 | 1/2020 | Bates |
| 2020/0259263 A1 | 8/2020 | Dani |
| 2020/0358160 A1 | 11/2020 | Alton |
| 2020/0403286 A1 | 12/2020 | Burdick |

OTHER PUBLICATIONS

Burdick, U.S. Appl. No. 17/013,504, U.S. Patent and Trademark Office, Sep. 9, 2020.
Nang, Search Report, Application No. or Patent No. 202010559946. 7, China National Intellectual Property Administration, Beijing, dated Jul. 2, 2021.
Yohannan et al., A Rectangular Dielectric Resonator Band Stop Filter, 2006 IEEE Antennas and Propagation Society International Symposium p. 3456, Kerala, India, Jul. 14, 2006.
Hassan Dani, U.S. Appl. No. 16/787,286, "Radio Frequency Device with Non-Uniform Cavities", filed Feb. 11, 2020 with priority to U.S. Appl. No. 62/805,199, filed Feb. 13, 2019.

* cited by examiner

DIELECTRIC CAVITY NOTCH FILTER

FIELD OF THE DISCLOSURE

The present disclosure relates generally to the field of dielectric resonator filters, including but not limited to dielectric resonator band stop filters, also referred to as dielectric resonator notch filters.

BACKGROUND

Dielectric resonators generally comprise a dielectric material, like ceramic, that functions as a resonator for electromagnetic (EM) waves, usually in microwave and millimeter bands. The waves are confined by a discontinuity in permittivity at boundaries of the resonator. Resonators resonate at a frequency determined by the overall physical dimensions of the resonator and the dielectric constant. Resonators can be used to control the frequency of EM waves and bandpass filters among other applications.

SUMMARY

A band stop filter can include a circuit board having a first surface and an opposing second surface. The circuit board can have a transmission line on the first surface. The band stop filter can include a dielectric cavity resonator physically coupled to the second surface of the circuit board. The dielectric cavity resonator can have a coupling aperture configured to magnetically couple the dielectric cavity resonator to the transmission line, and to cause excitation of the dielectric cavity resonator in a second order transverse electric (TE) mode.

A method can include providing a circuit board having a first surface, an opposing second surface, and a transmission line on the first surface. The method can include physically coupling a dielectric cavity resonator to the second surface of the circuit board, enabling a coupling aperture of the dielectric cavity resonator to magnetically couple the dielectric cavity resonator to the transmission line, and to cause excitation of the dielectric cavity resonator in a second order transverse electric (TE) mode.

The foregoing summary is illustrative only and is not intended to be in any way limiting. In addition to the illustrative aspects, embodiments, and features described above, further aspects, embodiments, and features will become apparent by reference to the following drawings and the detailed description.

BRIEF DESCRIPTION OF THE DRAWINGS

The foregoing and other features of the present disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

Figure 1:
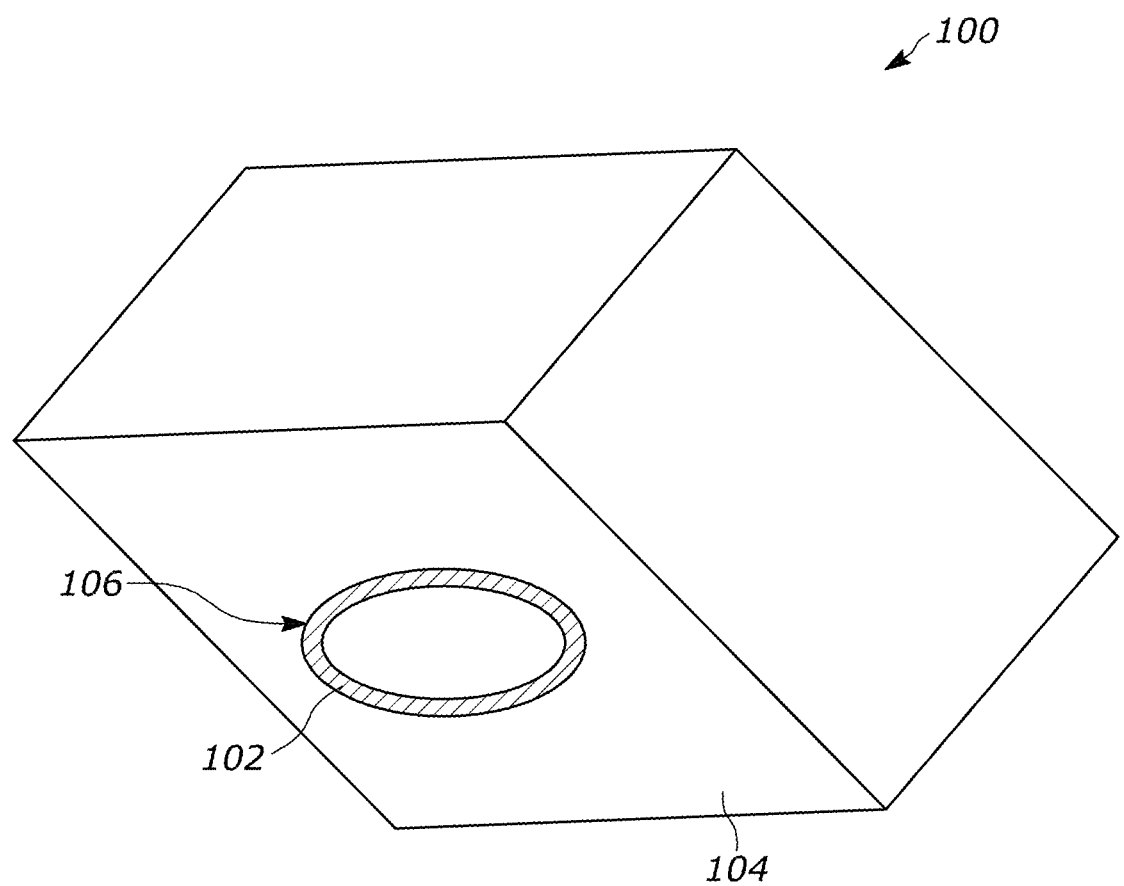
FIG. 1 shows an example dielectric cavity resonator, according to example embodiments of the current disclosure.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and make part of this disclosure.

DETAILED DESCRIPTION

Following below are more detailed descriptions of various concepts related to, and implementations of, methods, apparatuses, and systems for providing dielectric cavity notch filters, also referred to as dielectric cavity band stop filters. The various concepts introduced above and discussed in greater detail below may be implemented in any of numerous ways as the described concepts are not limited to any particular manner of implementation. Specific implementations and applications are provided primarily for illustrative purposes.

Many systems, such as radar systems, satellites, wireless communication systems, and military communication systems, can employ band stop (or notch) filters to attenuate signal energy at unwanted frequencies or frequency ranges. For instance, in the case of jamming, communication systems can block or attenuate signals associated with jamming frequencies using notch (or band stop) filters. In general, notch (or band stop) filters can be used to eliminate or mitigate undesired signals with known frequencies.

When designing notch or band stop filters, many criteria or desired features are usually considered. First, the deeper the notch of a band stop filter within the frequency stop band the higher is the attenuation of the undesired signals. Second, a high quality factor (or Q factor) is desired. For a notch filter with a corresponding center frequency (or notch frequency), the higher the quality factor of the filter the narrower is the stop band. Such feature allows for relatively narrow band rejection, and therefore, high selectivity of rejection frequencies. Other desired criteria or features include stability of the filter characteristics responsive to temperature variation, and the size of the filter. Temperature stability can guarantee stable (or the same) performance across a wide range of temperatures. Also, a relatively small size can provide flexibility in terms of using the filter, or a plurality of filters, within an integrated circuit or on a circuit board.

According to at least one aspect, a dielectric cavity notch (or band stop) filter allows for achieving these desired criteria or features. The dielectric cavity notch (or band stop) filter can include a dielectric cavity resonator having a coupling aperture to magnetically couple the dielectric cavity resonator to a transmission line that carries signals to be filtered. The dielectric cavity resonator can be configured to resonate at a respective resonance frequency and absorb electromagnetic energy associated with the transmission line leading to signal attenuation in the transmission line at the resonance frequency. The magnetic coupling through the coupling aperture, e.g., instead of a physical electric connection, between the dielectric cavity resonator and the transmission line can cause excitation of the dielectric cavity resonator in a second order transverse electric (TE) mode. That is, the second order TE mode can be more dominant compared to other TE modes (e.g., first order mode). The second order TE mode excitation results in a relatively deep notch (or stop band), for example, compared to the first order TE mode excitation. Direct (or physical) electric coupling (e.g., through electric wires) between the transmission line and the dielectric cavity resonator leads to first mode TE excitation.

The resonance frequency of the dielectric cavity resonator is equal to the notch frequency of the dielectric cavity notch (or band stop) filter. The stop (or notch) frequency of the band stop filter, which is equal to the resonance frequency of the dielectric cavity resonator, can be set by properly selecting the size (or dimensions) of the dielectric cavity resonator. In terms of filter design, one can adjust the size of the dielectric cavity resonator to achieve a desired stop band (or notch) frequency. Also, using ceramic as the dielectric material in the dielectric cavity resonator leads to a relatively high Q factor.

Referring to FIG. 1, an example dielectric cavity resonator 100 is shown according to example embodiments of the current disclosure. The dielectric cavity resonator 100 can include a piece of dielectric material (or substrate) 102 and a metalized surface 104. The outer surface of the piece of dielectric material 102 can be sputtered or coated with an electrically conductive metal, such as gold, to form the metalized surface 104. Other electrically conductive metals, such as silver, copper or other conductive metals can be used to form the metalized surface 104. The piece of dielectric material or substrate 102 can be made of ceramic or other dielectric material. Preferably, the piece of dielectric material 102 can be made of a dielectric material having a relatively high dielectric constant k (e.g., k>1), a relatively high quality factor Q (e.g., Q>100) at the desired notch frequency, and a relatively low (e.g., near zero) temperature coefficient. The higher the dielectric constant the more energy the dielectric cavity resonator 100 can store. A relatively high dielectric constant also allows for a relatively small size dielectric cavity resonator as more energy can be stored compared to a material having a relatively low dielectric constant. A higher quality factor indicates a lower rate of energy loss relative to the energy stored by the dielectric cavity resonator 100. A higher quality factor also allows for a narrower stop band, and therefore, higher selectivity of rejection frequencies. The lower the temperature coefficient the smaller is the change in the capacitance of the dielectric cavity resonator 100 over a predefined temperature range. Ceramic satisfies these characteristics, e.g., a relatively high Q factor, a relatively dielectric constant, and a relatively low temperature coefficient compared to many other dielectric materials.

The metalized surface 104 can include or define a coupling aperture 106. The coupling aperture 106 can be formed by etching out or creating a gap in the metalized surface 104. The coupling aperture 106 (e.g., via the gap) can magnetically excite the dielectric cavity resonator 100, at respective resonance frequency, by magnetically coupling the dielectric cavity resonator 100, for example, to a transmission line carrying electrical signals (not shown in FIG. 1). As discussed in further detail below, to achieve the magnetic coupling, the dielectric cavity resonator 100 can be positioned such that the coupling aperture 106 is adjacent to and/or facing the transmission line. The narrower the gap of the coupling aperture 106 (or the smaller the thickness of a segment or etched away trench/groove of the coupling aperture 106), the higher is the coupling between the dielectric cavity resonator 100 and the transmission line. The coupling aperture 106 can form (or have a shape of) a loop, such as a ring, an ellipse-shaped loop, a rectangular loop, a square-shaped loop, or a loop of other shape. The coupling aperture 106 can have other shapes, e.g., other than a loop. For instance, the coupling aperture 106 can have a C-shape, a U-shape or other shapes. A loop-shaped coupling aperture can provide better magnetic coupling, and therefore, better excitation than a non-symmetric coupling aperture such as a C-shaped or U-shaped coupling aperture. Yet, a C-shaped and/or a U-shaped coupling aperture, among other apertures having other shapes, are contemplated by the current disclosure.

The piece of dielectric material 102, or the dielectric cavity resonator 100, can have a cubic shape, a parallelepiped-shape, a cylindrical shape or other shape. In the case where the piece of dielectric material 102 has a cylindrical shape, the coupling aperture 106 can be formed or arranged at one of the circular bases of the cylinder. The resonance frequency of the dielectric cavity resonator 100 depends on the size of the piece of dielectric material 102. As such, for a dielectric cavity resonator 100 with a given shape, the respective size can be selected to achieve a predefined or desired resonance frequency. The piece of dielectric material 102 can be positioned on, or adjacent to, a circuit board including a transmission line to form or achieve a notch (or band stop) filter.

The dielectric cavity resonator 100 can have $TE_{mnl}$ and $TM_{mnl}$ modes, which correspond to resonant frequencies based on the dielectric constant k and the size of the dielectric cavity resonator 100 (or the size of the corresponding piece of dielectric material 102). The parameters m, n and l represent integer values and the resonance frequency for each mode $TE_{mnl}$ or $TM_{mnl}$ mode can be defined or calculated as $$f_{mnl} = \frac{c}{2\sqrt{\varepsilon_r}} \sqrt{\left(\frac{m}{a}\right)^2 + \left(\frac{n}{b}\right)^2 + \left(\frac{l}{d}\right)^2},$$

where a, b and c represent the width, height and length of the dielectric cavity resonator 100, respectively. Certain modes can be dominant or suppressed depending on how the dielectric cavity resonator 100 is excited. For instance, as discussed in further detail below, the $TE_{102}$ mode can be dominant when the dielectric cavity resonator 100 is magnetically coupled to a transmission line, while the $TE_{101}$ mode can be suppressed. On the other hand, when the dielectric cavity resonator 100 is electrically coupled (e.g., through electric wire connection) to the transmission line, the $TE_{101}$ mode can be dominant while the $TE_{102}$ mode can be suppressed.

Figure 2:
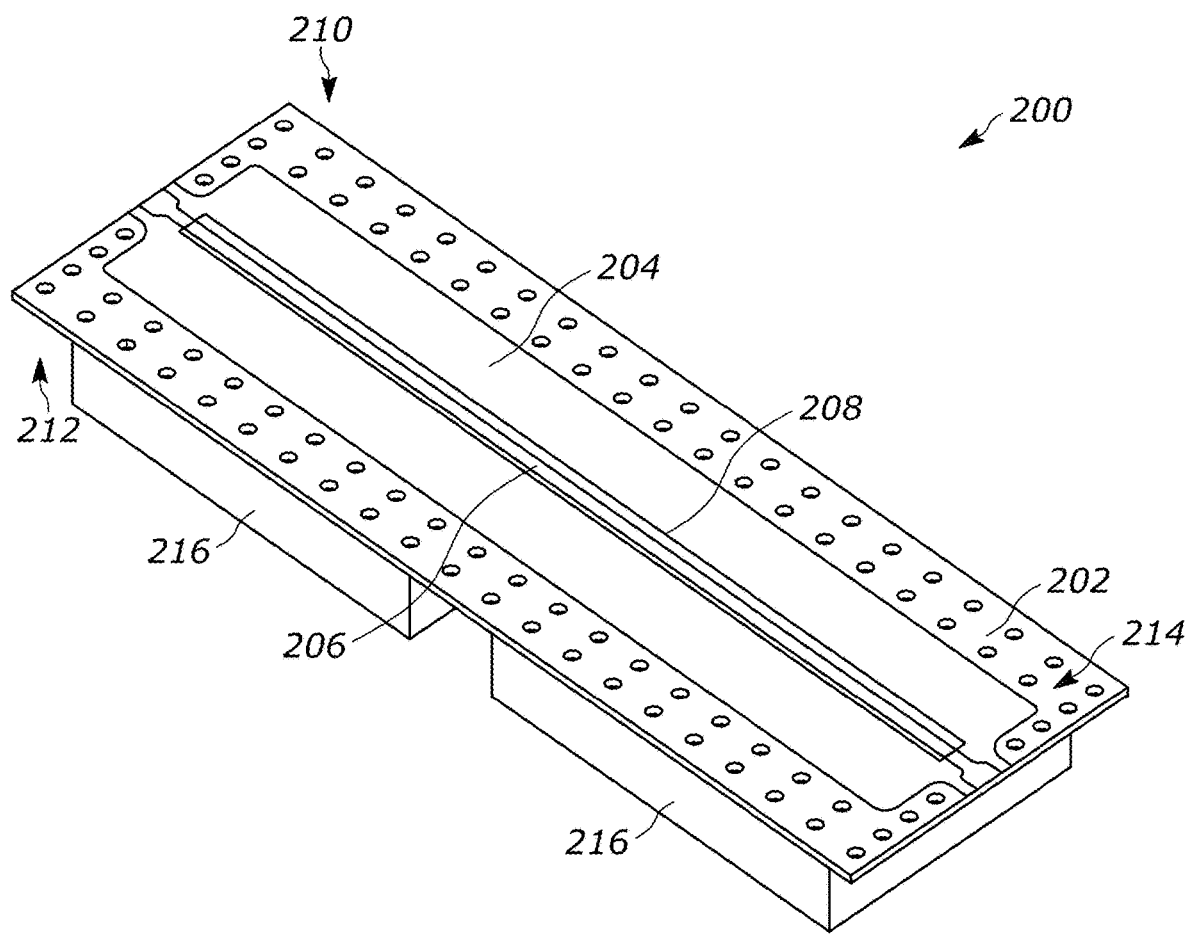
FIG. 2 shows an example circuit board for use in a dielectric cavity notch, or band stop, filter, according to example embodiments of the current disclosure.

Referring to FIG. 2, an example circuit board 200 for use in a dielectric cavity notch, or band stop, filter is shown according to example embodiments of the current disclosure. The circuit board 200 can include a metal-coated (or metallized) region 202 and a non-coated region 204 (e.g., a region that is not metallized, or not coated with metal). The non-coated region 204 can extend, for example, along a longitudinal dimension of the circuit board 200. The metal-coated region 202 can be coated, for example, with copper or other conductive metal. The circuit board 200 can include a transmission line 206 running across the non-coated region 204. The circuit board 200 can have a first surface 210 (e.g., front facing surface) and a second opposing surface 212 (e.g., back surface) with the transmission line 206 printed on the first surface 210. The transmission line 206 can be coated with a solder mask 208 of an insulating material (e.g., a polymer). The transmission line 206 can be part of an electric circuit (not shown in FIG. 2). The transmission line 206 can carry electric signals to be filtered (e.g., blocked or attenuated) by the notch, or band stop, filter (not shown in FIG. 2). The circuit board 200 can include a substrate layer 214 which includes the metal-coated region 202 and the non-coated region 204. One or more dielectric cavity resonators 216, such as resonator 100, can be arranged on or mechanically coupled to the second surface 212 of the circuit board 200. The circuit board 200 can be, or can include, a monolithic board having a single layer substrate. The single layer substrate can be at least partially metal-coated, e.g., with copper, on opposing sides of the single layer substrate.

The circuit board 200 shown in FIG. 2 represents an illustrative example and is not to be viewed as limiting. For example, the non-coated region 204 can have a rectangular shape, a square shape, a circular shape, or other shape. Also, the non-coated region 204 and/or the transmission line 206 can extend along a portion of the circuit board 200. In some implementations, the transmission line 206 can run along a void region (e.g., a hole in the circuit board 200) instead of a non-coated region 204. The size (e.g., length and/or width) of the non-coated (or void) region 204 can vary based, for example, on the design of the circuit, and on the number and size(s) of dielectric cavity resonators to be physically or mechanically coupled to the circuit board 200. The circuit board 200 can have a rectangular shape, a square shape or other shape.

Figure 3:
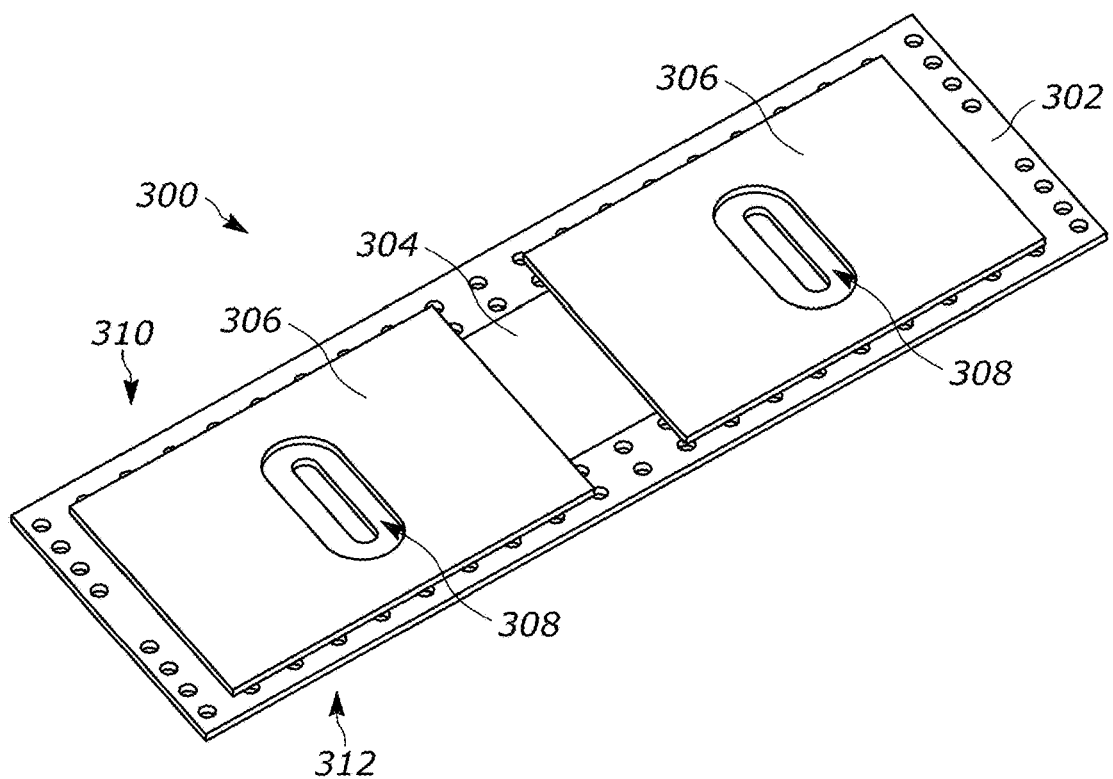
FIG. 3 depicts an example circuit board having pads for seating dielectric cavity resonators, according to example embodiments of the current disclosure.

Referring to FIG. 3, an example circuit board 300 having pads 306 for seating dielectric cavity resonators is shown, according to example embodiments of the current disclosure. The circuit board 300 can be similar to the circuit board 200 described above with regard to FIG. 2. For instance, the circuit board 300 can include a metal-coated region 302, a non-coated region 304 and a transmission line (not shown in FIG. 3). The circuit board 300 can also include two pads 306 for seating two dielectric cavity resonators (not shown in FIG. 3), such as dielectric cavity resonator 100. The pads 306 can include silver coated epoxy pads. The pads 306 can be coated with other conductive metal, such as gold or copper, among other conductive metals. Each pad 306 can be viewed as a metal-coated layer. Each pad (or metal coated layer) 306 can include a respective coupling aperture 308 that matches or corresponds to the coupling aperture 106 of the corresponding dielectric cavity resonator 100, for example, in size and shape.

The pads 306 can be positioned or arranged on a first surface 310 of the circuit board while the transmission line can be arranged (e.g., printed) on a second opposing surface 312 of the circuit board 300. The surface 310 corresponds to the surface 212 in FIG. 2, and the surface 312 corresponds to the surface 210 in FIG. 2. Each pad 306 can be mechanically coupled to (e.g., via screws or adhesive) to the first surface 310 of the circuit board 300. Each pad 306 can be used for seating a corresponding dielectric cavity resonator 100. Each dielectric cavity resonator 100 can be positioned on a corresponding pad 306 such that the respective coupling aperture 106 faces and is aligned with the coupling aperture 308 of the corresponding pad 306. As such, both coupling apertures 106 and 308 can excite the dielectric resonator 100 when positioned on the corresponding pad 306 in proximity to the transmission line 206. In any case, the dielectric cavity resonator(s), such as resonator(s) 216 of FIG. 2 or resonator 100 of FIG. 1, can be magnetically coupled but not electrically coupled to the transmission line, such as transmission line 206.

Figure 4:
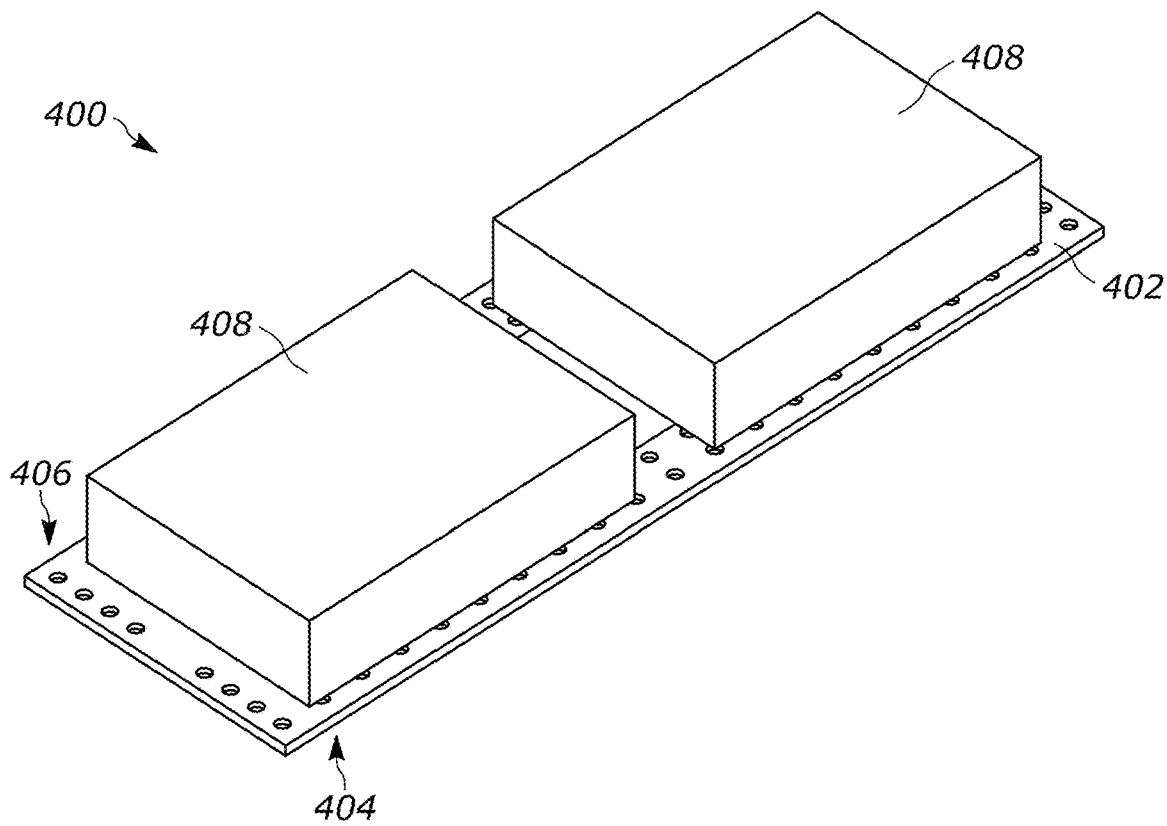
FIG. 4 shows an example band stop filter, according to example embodiments of the current disclosure.

Referring to FIG. 4, an example band stop filter 400 is shown, according to example embodiments of the current disclosure. The band stop filter 400 can include a circuit board 402, for example, similar to the circuit boards 200 and/or 300 discussed above with regard to FIGS. 2 and 3. The circuit board 402 can have a first surface 404 and an opposing second surface 406. The circuit board 402 can include a transmission line (not shown in FIG. 4) arranged (e.g., printed, formed and/or visible) on the first surface 404 of the circuit board 402. The band stop filter 400 can include one or more dielectric cavity resonators 408 physically or mechanically coupled to the second surface 406 of the circuit board 402. While the band stop filter of FIG. 4 is shown to include two dielectric cavity resonators 408, in general, the band stop filter 400 can include one or a plurality (e.g., two, three, four or other number) of dielectric cavity resonators 408. Each dielectric cavity resonator 408 can be similar to dielectric cavity resonator 100 described in relation with FIG. 1. For instance, each dielectric cavity resonator 408 can include a coupling aperture, such as coupling aperture 106 of FIG. 1, configured to magnetically couple the dielectric cavity resonator 408 to the transmission line, and to cause excitation of the dielectric cavity resonator 408 in a second order transverse electric (TE) mode, also referred to as TE102 mode.

As discussed above with regard to FIG. 2, the transmission line can be coated with a solder mask of an electrical insulator material (e.g., a polymer). Specifically, a side of the transmission line facing away from the circuit board 402 (or from the surface 404) can be coated with the insulator material. The coupling aperture of each dielectric cavity resonator 408 (e.g., coupling aperture 106 shown in FIG. 1) can face the second surface 406 and can be aligned with the transmission line that is positioned or printed on the first surface 404 of the circuit board 402. For instance, if the aperture of each dielectric cavity resonator 408 has an elliptical or circular shape, a centerline of the aperture can be aligned with (e.g., positioned physically above) the transmission line on the other side of the circuit board 402. The coupling aperture of each dielectric cavity resonator 408 can be separated from the transmission line by at least a thickness of the circuit board 402 or the respective substrate. The transmission line may not be in electrical contact with the dielectric cavity resonator(s) 408.

The circuit board 402 can include one or more pads, such as pads 306 of FIG. 3, (not shown in FIG. 4) mechanically coupled to the second surface 406 of the circuit board 402. Each dielectric cavity resonator 408 can be positioned on, and physically coupled to, a corresponding pad. Each pad can include a respective coupling aperture, such as coupling aperture 308 of FIG. 3 that matches and is aligned with (e.g., abutted or lined up with) the coupling aperture of the dielectric cavity resonator 408 (e.g., coupling aperture 106 shown in FIG. 1) seated on the pad. The coupling aperture of each dielectric cavity resonator 408 can be separated from the transmission line by at least the sum of a thickness of the circuit board 402 and a thickness of the pads. In some implementations, each dielectric cavity resonator 408 can be positioned directly (e.g., with no pads) on the second surface 406 of the circuit board 402.

As used herein, the TE102 mode implies that the electric field generated in each dielectric cavity resonator 408 due to excitation has a pair of extrema (e.g., a pair of maxima) or forms a pair of lobes. The TE102 mode, or second order TE mode, can be achieved (e.g., is dominant over other TE modes) when the dielectric cavity resonator 408 is magnetically coupled, but not electrically coupled, to the transmission line. In other words, there is no electrical connection between the transmission line and any of the dielectric cavity resonators 408. As electric signals travel in the transmission line they generate a magnetic field around the transmission line. At the resonance frequency of the dielectric cavity resonator(s) 408, the magnetic field generated around the transmission line can excite the dielectric cavity resonator(s) 408 via the aperture coupling(s) 106 and/or the aperture coupling(s) 308. Specifically, at the resonance frequency, electromagnetic energy associated with the transmission line can get absorbed into the dielectric cavity resonator(s) 408 causing the dielectric cavity resonator(s) 408 to oscillate electromagnetically, and causing attenuation of signals traveling through the transmission line. The metal coating around the dielectric material of the resonator(s) 408 can keep the electromagnetic energy within the resonator(s) 408. As such, the dielectric cavity resonator(s) 408 can act as a band stop (or notch) filter that attenuates signals traveling through the transmission line at the resonance frequency of the dielectric cavity resonator(s) 408. That is, the resonance frequency of the dielectric cavity resonator(s) 408 can be equal to the notch (or rejection) frequency of the band stop filter.

As the distance between the transmission line and the dielectric cavity resonator(s) 408 gets smaller, the magnetic coupling between them gets stronger. Also, the narrower is the coupling aperture (e.g., coupling aperture 106), the stronger can be the magnetic coupling between the transmission line and the dielectric cavity resonator(s) 408. Furthermore, a symmetric loop-shaped coupling aperture can perform better in terms of exciting the dielectric cavity resonator(s) 408 according to a second order TE mode (or TE102 mode).

Each dielectric cavity resonator 408 can have a coefficient of thermal expansion (CTE) substantially equal to (e.g., equality within a margin of error less than or equal to 20%) the CTE of the circuit board 402. The CTE can be one of the factors or criteria considered in selecting the type of dielectric cavity resonator to be used. For instance, the dielectric cavity resonator can include a metal-coated ceramic substrate or material where the CTE of the ceramic substrate or material is substantially equal to (or substantially match) the CTE of the circuit board used. A match (e.g., equality within a margin of error less than or equal to 20%) between the CTE of the circuit board 402 and the CTE of the dielectric cavity resonator(s) 408 can reduce the likelihood of a potential warping or cracking in the circuit board 402 or the dielectric cavity resonator(s) 408, or a cracking in any adhesive material mechanically coupling the dielectric cavity resonator(s) 408 to the circuit board 402. Such warping or cracking can negatively affect, for example, the alignment between the coupling aperture 106 and any coupling aperture 308 or the alignment between the coupling aperture 106 and the transmission line.

Using a plurality of dielectric cavity resonator(s) 408 having the same resonance frequency and each of which being magnetically coupled to the transmission line (as discussed above) can also lead to a deeper notch or deeper stop band (e.g., in decibels (dBs)) of the band stop filter 400. The larger the number of dielectric cavity resonators 408 used the higher is the signal attenuation at the resonance frequency. Specifically, each dielectric cavity resonator 408 in a sequence of resonators absorbs more of the electromagnetic energy generated by the transmission line at the resonance frequency leading to higher attenuation of the signal traveling through the transmission line, and therefore, a more effective notch or band stop filter 400.

The magnetic coupling between the dielectric cavity resonator(s) 408 and the transmission line (e.g., instead of electric connection) allows for a notch frequency within a wideband frequency range. For instance, the notch frequency (or center frequency of stop band) of the band stop filter 400, which is equal to the resonance frequency of the dielectric cavity resonator(s) 408, can be any frequency within a frequency range of 2 GHz to 30 GHz. As discussed above, the resonance frequency can be set by properly selecting the dimensions of the dielectric cavity resonator(s) 408. Accordingly, depending on the resonance frequency of the dielectric cavity resonator(s) 408, the notch filter 400 can attenuate signals (propagating in the transmission line) at a frequency within the frequency range of 2 GHz to 30 GHz.

Figure 5A:
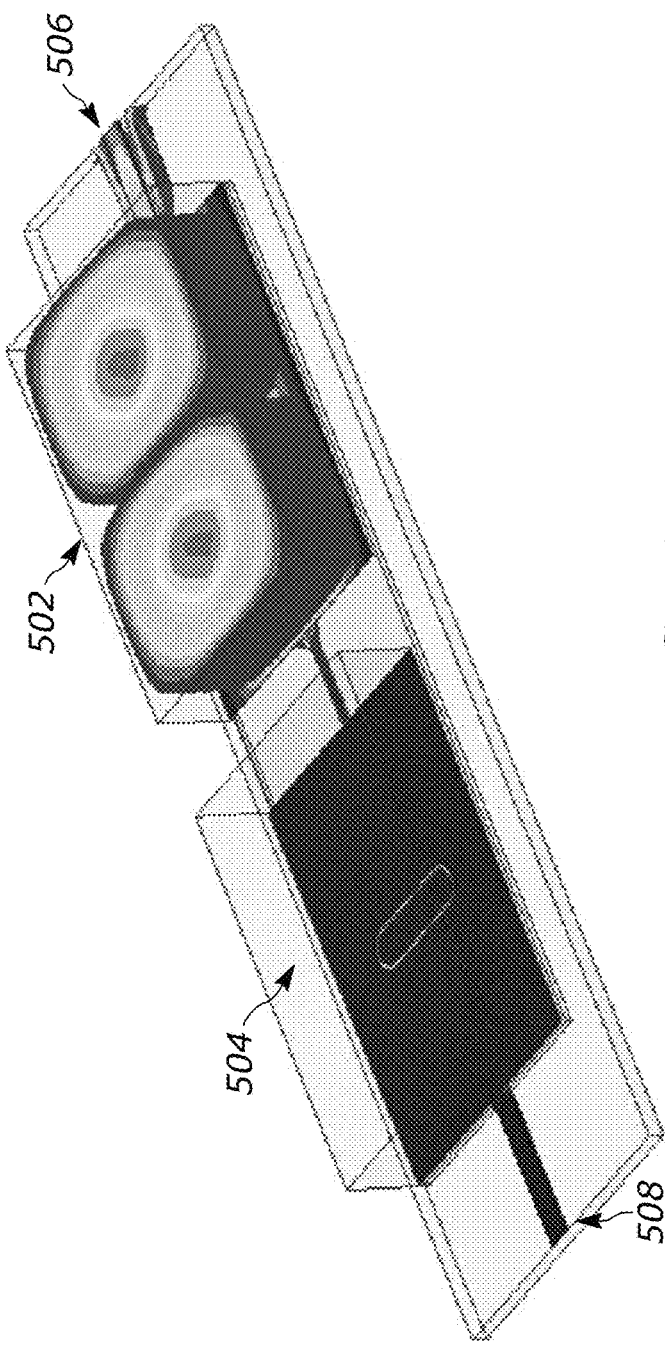
FIGS. 5A-5C show simulation results of the band stop filter of FIG. 4.
Figure 5A:
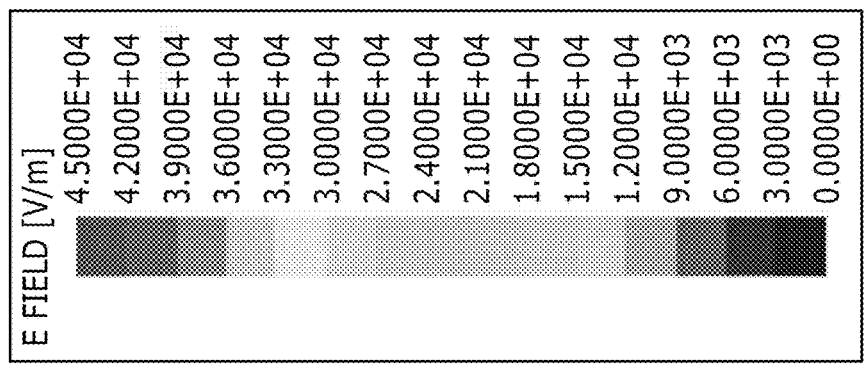
Figure 5B:
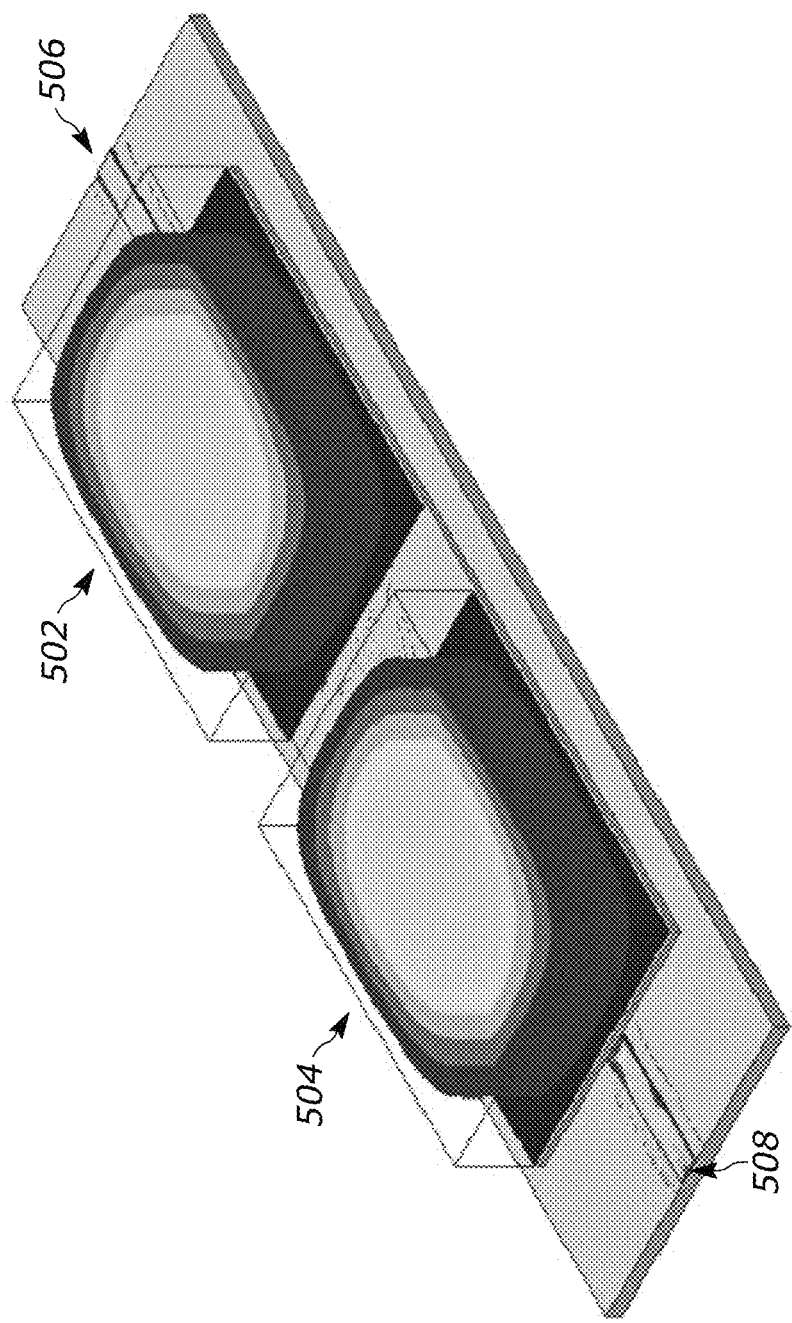
Figure 5C:
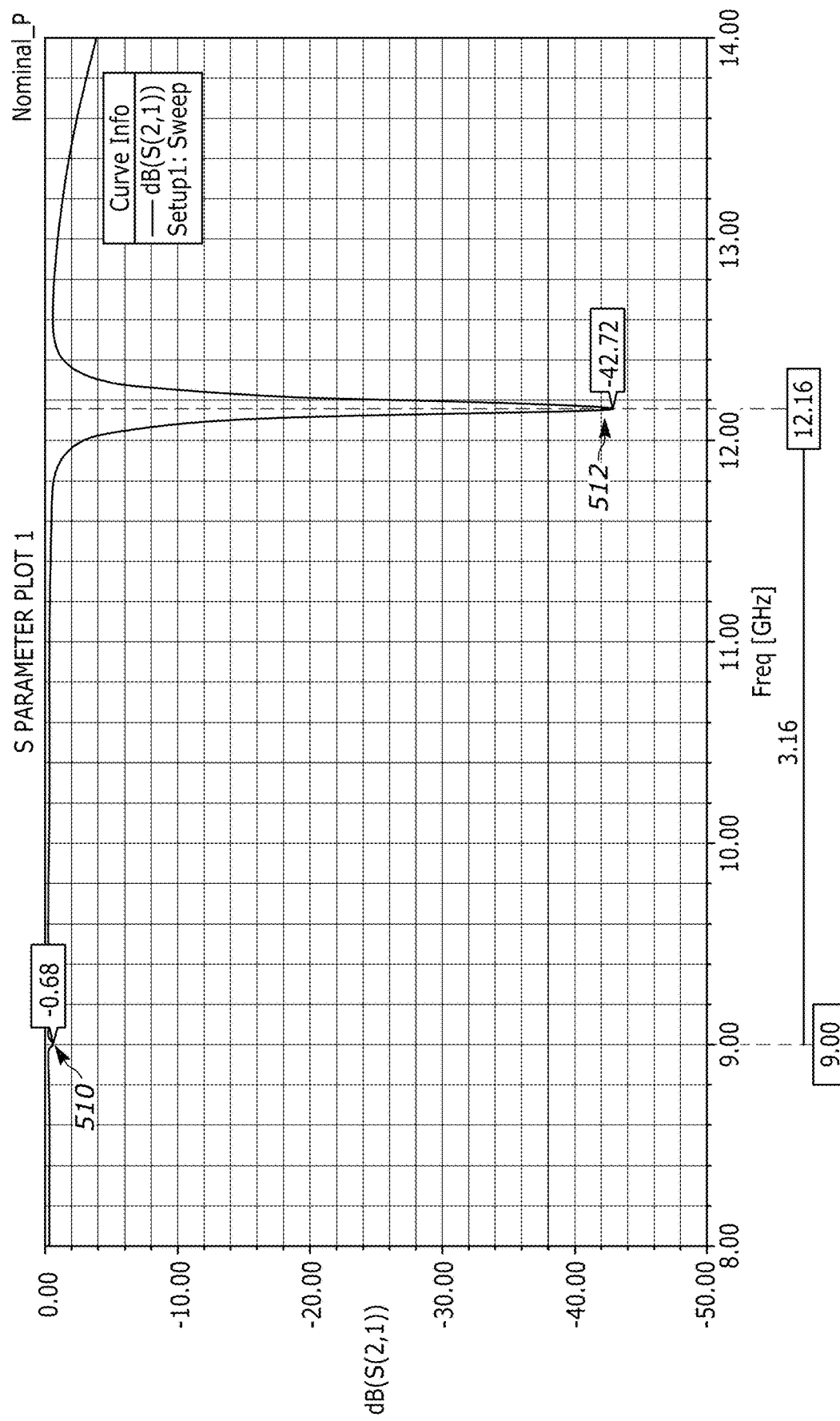

Referring to FIGS. 5A-5C, simulation results of the band stop filter of FIG. 4 are shown, according to example embodiments of the current disclosure. The simulated band stop filter includes two dielectric cavity resonators. Each of the dielectric cavity resonators is a metal-coated ceramic substrate having a loop-shaped aperture etched out in the metal coating. FIG. 5A shows the electric field within the dielectric cavity resonators 502 and 504 at the resonance frequency (e.g., 12.16 GHz). At the resonance frequency, the second order TE mode (or TE102 mode) is dominant. In the TE102 mode, the electric field generated within the first dielectric cavity resonator 502 (at the resonance frequency) has two peaks (or two lobes), while the electric field in the second cavity resonator 504 looks insignificant, at least compared to the electric field in the first dielectric cavity resonator 502. At the input 502 of the band stop filter, the electric field associated with the transmission line shows electric (or signal) energy at the input 502. However, the output 504 of the band stop filter, the electric field associated with the transmission line shows no electric (or signal) energy at the output 504, which indicates that the band stop filter is attenuating signal transmission within the transmission line significantly. In fact, the signal attenuation is significant enough that the second dielectric cavity resonator 504 does not seem to resonate due to the little or no energy left in the transmission line past the first dielectric cavity resonator 502.

FIG. 5B shows the electric field within the dielectric cavity resonators 502 and 504 at an excitation frequency (e.g., 9 GHz) where the first order mode, or TE 101 mode, is dominant. The electric field in each of the dielectric cavity resonators 502 or 504 exhibits a single peak (or single lobe). The electric field at the output 508 of the transmission line illustrates that there still is signal transmission past the dielectric cavity resonators 502 and 504. Also, unlike the simulation results shown in FIG. 5A, the electric field within the second dielectric cavity resonator 504 of FIG. 5B is significant at least compared to the electric field within the first dielectric cavity resonator 502 of FIG. 5B. These observations, indicate the notch filter is not significantly attenuating signal transmission within the transmission line when excited at the first order TE mode or TE101 mode compared to the second order TE mode or the TE102 mode.

FIG. 5C shows a plot of the s-parameter S12, transmission response of the notch filter from input 506 to output 508, across the frequency range 8 to 14 GHz in decibels (dBs). It can be seen that there is a slight minimum at where the TE101 mode occurs (e.g., 9 GHz), and a more significant minimum at the resonance frequency (e.g., 12.16 GHz) where the TE102 mode occurs. The S21 plot in FIG. 5C illustrates that a deep notch occurs when the dielectric cavity resonators 502 and 504 are excited according to the TE 102 mode. Such notch is much more significant than the signal attenuation that occurs when the TE101 mode is dominant.

Figure 6:
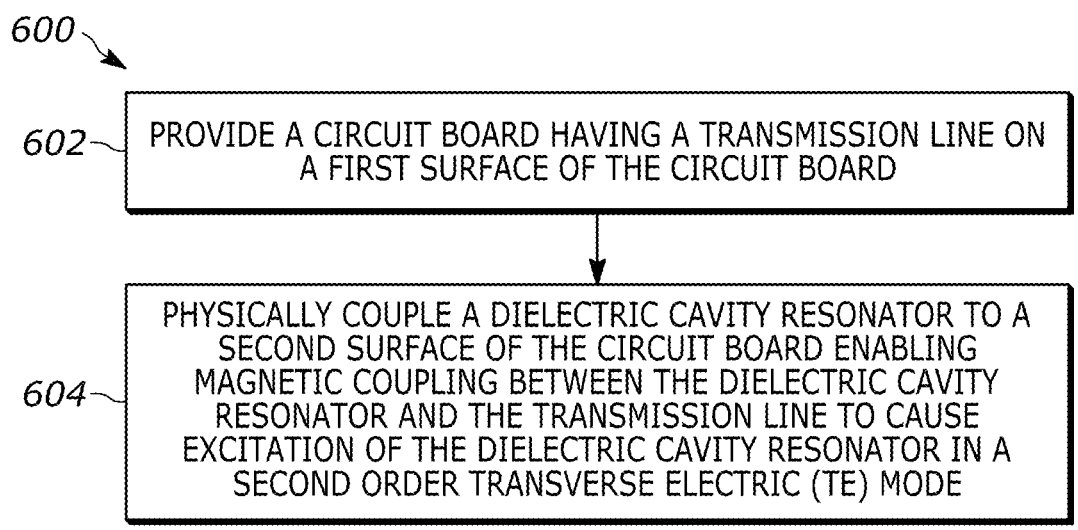
FIG. 6 shows a flow chart of a method for providing a dielectric cavity band stop (or notch) filter, according to example embodiments of the current disclosure.

Referring to FIG. 6, a flowchart of a method 600 of providing a dielectric cavity band stop (or notch) filter is shown, according to example embodiments of the current disclosure. The method 600 can include providing a circuit board having a first surface, an opposing second surface, and a transmission line on the first surface (step 602). The method 600 can include physically coupling a dielectric cavity resonator to the second surface of the circuit board, enabling a coupling aperture of the dielectric cavity resonator to magnetically couple the dielectric cavity resonator to the transmission line and to cause excitation of the dielectric cavity resonator in a second order transverse electric (TE) mode (step 604).

The method 600 can include providing a circuit board having a first surface, an opposing second surface, and a transmission line on the first surface (step 602). Providing the circuit board can include manufacturing the circuit board. The circuit board can be as discussed above with regard to any of FIGS. 2-4. For instance, a side of the transmission line facing away from the circuit board (or from the first surface) can be coated with an insulator material such as a polymer.

The method 600 can include physically coupling a dielectric cavity resonator to the second surface of the circuit board (step 604). The method 600 can include providing the dielectric cavity resonator and physically coupling the dielectric cavity resonator to the second surface of the circuit board. Providing the dielectric cavity resonator can include cutting, sizing and/or making a piece of dielectric material according to a specific (or predefined) shape and a specific (or predefined) size to achieve a desired resonance frequency. The shape and/or size of the piece of dielectric material can be defined (or determined) based on the desired resonance frequency of the dielectric cavity resonator that is equal to the notch or stop band frequency of the band stop filter. Providing the dielectric cavity resonator can also include coating the piece of dielectric material with a metal, such as gold, silver, copper or other electrically conductive metal. Providing the dielectric cavity resonator can also include etching out the metal coating to form a coupling aperture. The coupling aperture can be similar to the coupling aperture 106 discussed with regard to FIG. 1.

Physically coupling the dielectric cavity resonator to the second surface of the circuit board can include positioning the dielectric cavity resonator on the second surface with the respective coupling aperture facing the second surface and aligned with the transmission line positioned on the first surface of the dielectric cavity resonator as discussed above with regard to FIG. 4. The method 600 can include physically coupling the dielectric cavity resonator directly to the second surface, for example, via an adhesive, screws, soldering, or other mechanical coupling mechanism. The coupling aperture of the dielectric cavity resonator can magnetically couple the dielectric cavity resonator to the transmission line, and cause excitation of the dielectric cavity resonator in a second order transverse electric (TE) mode, as discussed above with regard to FIGS. 1-4.

The method 600 can include providing or placing a conductive layer between the circuit board and the dielectric cavity resonator. The conductive layer can be a metal coated epoxy having a respective coupling aperture that is aligned with the coupling aperture of the dielectric cavity resonator as discussed above with regard to FIGS. 3-4. The coupling apertures of the conductive layer and the dielectric cavity resonator can have a similar shape and size. The method 600 can include securing, or physically coupling, the conductive layer to the circuit board, for example, via an adhesive, screws, soldering, or other mechanical coupling mechanism such that the coupling aperture of the conductive layer is aligned with the transmission line. The method 600 can also include securing, or physically coupling, the dielectric cavity resonator to the conductive layer, for example, via an adhesive, screws, soldering, or other mechanical coupling mechanism such that the coupling aperture of the dielectric cavity resonator is aligned with the transmission line and the coupling aperture of the conductive layer. The coupling aperture of the conductive layer and the coupling aperture of the dielectric cavity resonator can magnetically couple the dielectric cavity resonator to the transmission line, and cause excitation of the dielectric cavity resonator in a second order transverse electric (TE) mode, as discussed above with regard to FIGS. 1-4. Whether using a conductive layer or not, the method 600 can include aligning the coupling aperture of the dielectric cavity resonator with the transmission line such that coupling aperture is separated from the transmission line by at least a thickness of the circuit board.

The method 600 can include physically coupling a plurality of dielectric cavity resonators to the circuit board, as discussed above with regard to FIG. 4. Each of the dielectric cavity resonators can be secured, or physically coupled, to the circuit board either directly or with a corresponding conductive layer placed between the dielectric cavity resonator and the circuit board. Each of the plurality of dielectric cavity resonators can include a respective coupling aperture that is aligned with the transmission line to magnetically couple the dielectric cavity resonator to the transmission line. Using a plurality of dielectric cavity resonators allows for achieving a deeper notch (or stop band) of the notch filter.

The herein described subject matter sometimes illustrates different components contained within, or connected with, different other components. It is to be understood that such depicted architectures are illustrative, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.).

It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B." Further, unless otherwise noted, the use of the words "approximate," "about," "around," "substantially," etc., mean plus or minus ten percent.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A band stop filter comprising:
   a circuit board having a first surface and an opposing second surface, the circuit board having a transmission line on the first surface; and
   a dielectric cavity resonator physically coupled to the second surface of the circuit board, and having a coupling aperture configured to magnetically couple the dielectric cavity resonator to the transmission line, and to cause excitation of the dielectric cavity resonator in a second order transverse electric (TE) mode,
   wherein the dielectric cavity resonator has a resonance frequency equal to a notch frequency of the band stop filter.

2. The band stop filter of claim 1, wherein the coupling aperture corresponds to a loop-shaped gap on a metallized surface of the circuit board.

3. The band stop filter of claim 1, wherein the dielectric cavity resonator comprises a metal-coated ceramic substrate.

4. The band stop filter of claim 1, wherein the dielectric cavity resonator has a coefficient of thermal expansion (CTE) substantially equal to a CTE of the circuit board.

5. The band stop filter of claim 1, comprising a plurality of dielectric cavity resonators physically coupled to the circuit board, each of the plurality of dielectric cavity resonators magnetically coupled to the transmission line via a respective coupling aperture.

6. The band stop filter of claim 1, comprising a conductive layer arranged between the circuit board and the dielectric cavity resonator, the conductive layer having a coupling aperture that is aligned with the coupling aperture of the dielectric cavity resonator.

7. The band stop filter of claim 6, wherein the coupling aperture of the conductive layer comprises a loop-shaped gap on the conductive layer.

8. The band stop filter of claim 7, wherein the loop-shaped gap has a circular or elliptical structure.

9. The band stop filter of claim 1, wherein the circuit board includes a single layer substrate that is at least partially coated with copper on opposing sides of the single layer substrate.

10. The band stop filter of claim 1, wherein the coupling aperture is aligned with the transmission line and separated from the transmission line by at least a thickness of the circuit board.

11. The band stop filter of claim 1, wherein a side of the transmission line facing away from the circuit board is coated with an insulator material.

12. The band stop filter of claim 1, wherein the dielectric cavity resonator is configured to attenuate a signal at a frequency within a frequency range of 2 GHz to 30 GHz.

13. A method comprising:
   providing a circuit board having a first surface and an opposing second surface, the circuit board having a transmission line on the first surface;
   sizing a dielectric cavity resonator to have a resonance frequency equal to a notch frequency of the band stop filter; and physically coupling the dielectric cavity resonator to the second surface of the circuit board, enabling a coupling aperture of the dielectric cavity resonator to magnetically couple the dielectric cavity resonator to the transmission line, and to cause excitation of the dielectric cavity resonator in a second order transverse electric (TE) mode.

14. The method of claim 13, further comprising physically coupling a plurality of dielectric cavity resonators to the circuit board, enabling each of the plurality of dielectric cavity resonators to magnetically couple to the transmission line via a respective coupling aperture.

15. The method of claim 13, further comprising providing a conductive layer between the circuit board and the dielectric cavity resonator, the conductive layer having a coupling aperture that is aligned with the coupling aperture of the dielectric cavity resonator.

16. The method of claim 15, further comprising forming a coupling aperture on the conductive layer that comprises a loop-shaped gap on the conductive layer.

17. The method of claim 13, further comprising forming the coupling aperture as a loop-shaped gap on a metallized surface of the dielectric cavity resonator.

18. The method of claim 13, further comprising aligning the coupling aperture with the transmission line while separated from the transmission line by at least a thickness of the circuit board.

19. A band stop filter comprising:
a circuit board having a first surface and an opposing second surface, the circuit board having a transmission line on the first surface; and
a dielectric cavity resonator physically coupled to the second surface of the circuit board, and having a coupling aperture configured to magnetically couple the dielectric cavity resonator to the transmission line, and to cause excitation of the dielectric cavity resonator in a second order transverse electric (TE) mode,
wherein the dielectric cavity resonator has a coefficient of thermal expansion (CTE) substantially equal to a CTE of the circuit board.

\* \* \* \* \*